United States Patent
Hsu et al.

(10) Patent No.: US 8,053,287 B2
(45) Date of Patent: Nov. 8, 2011

(54) METHOD FOR MAKING MULTI-STEP PHOTODIODE JUNCTION STRUCTURE FOR BACKSIDE ILLUMINATED SENSOR

(75) Inventors: Tzu-Hsuan Hsu, Kaohsiung (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 489 days.

(21) Appl. No.: 11/537,265

(22) Filed: Sep. 29, 2006

(65) Prior Publication Data

US 2008/0079030 A1 Apr. 3, 2008

(51) Int. Cl.
*H01L 21/339* (2006.01)

(52) U.S. Cl. .......... 438/144; 438/48; 257/E21.532; 257/E27.133

(58) Field of Classification Search .......... 438/48, 438/373, 374, 144, 60, 70, 75, 59, 191, 200; 257/E27.134, E27.13, E27.131, E27.132, 257/E27.133, 447, 292, 460–462, 229, 228, 257/291, 443, E21.35, E21.532

See application file for complete search history.

(56) References Cited

U.S. PATENT DOCUMENTS

| | | | |
|---|---|---|---|
| 6,486,521 B2 * | 11/2002 | Zhao et al. | 257/443 |
| 6,589,823 B1 * | 7/2003 | Beebe et al. | 438/151 |
| 6,809,309 B2 * | 10/2004 | Kwon | 250/214.1 |
| 6,909,162 B2 * | 6/2005 | Wu et al. | 257/461 |
| 7,312,484 B1 * | 12/2007 | Drowley et al. | 257/187 |
| 7,488,997 B2 * | 2/2009 | Kuwazawa | 257/233 |
| 7,535,073 B2 * | 5/2009 | Ezaki | 257/440 |
| 2001/0054724 A1 * | 12/2001 | Kamashita et al. | 257/258 |
| 2002/0017695 A1 * | 2/2002 | Zhao et al. | 257/461 |
| 2003/0042511 A1 * | 3/2003 | Rhodes | 257/232 |
| 2004/0135065 A1 * | 7/2004 | Jang | 250/208.1 |
| 2004/0183109 A1 * | 9/2004 | Kuriyama | 257/292 |
| 2004/0251468 A1 * | 12/2004 | Mouli et al. | 257/80 |
| 2005/0118768 A1 * | 6/2005 | Chen | 438/301 |
| 2005/0139828 A1 * | 6/2005 | Maruyama et al. | 257/59 |

(Continued)

FOREIGN PATENT DOCUMENTS

TW 586198 5/2004

(Continued)

OTHER PUBLICATIONS

Taiwanese Patent Office, mailed Feb. 22, 2010, Application No. 32589, 5 pages.

*Primary Examiner* — Matthew Landau
*Assistant Examiner* — Latanya N Crawford
(74) *Attorney, Agent, or Firm* — Haynes and Boone, LLP

(57) ABSTRACT

A method of making a backside illuminated sensor is provided. A substrate is provided and a high energy ion implantation is performed over the substrate to implant a first doped region. A layer is formed over the substrate and a self-align high energy ion implantation is performed over the substrate to implant a second doped region over the first doped region. The combined thickness of the first and second doped region is greater than 50 percent of thickness of the substrate and the distance between back surface of the substrate and the first and second doped regions is less than 50 percent of thickness of the substrate. In this way, an enlarged light sensing region is formed through which electrons generated from back surface of the surface may easily reach the pixel.

20 Claims, 6 Drawing Sheets

U.S. PATENT DOCUMENTS

| | | | |
|---|---|---|---|
| 2005/0167708 A1* | 8/2005 | Rhodes et al. | 257/291 |
| 2005/0170545 A1* | 8/2005 | Rhodes | 438/48 |
| 2005/0179053 A1* | 8/2005 | Ezaki et al. | 257/189 |
| 2005/0224844 A1* | 10/2005 | Mizuguchi | 257/233 |
| 2005/0230681 A1* | 10/2005 | Folkerts et al. | 257/53 |
| 2006/0145205 A1* | 7/2006 | Kim | 257/291 |
| 2006/0197007 A1* | 9/2006 | Iwabuchi et al. | 250/208.1 |
| 2006/0226428 A1* | 10/2006 | Mouli | 257/59 |
| 2006/0226438 A1* | 10/2006 | Katsuno et al. | 257/113 |
| 2007/0012970 A1* | 1/2007 | Mouli | 257/292 |
| 2007/0034898 A1* | 2/2007 | Tennant et al. | 257/184 |
| 2007/0042519 A1* | 2/2007 | Nomura et al. | 438/34 |
| 2007/0054434 A1* | 3/2007 | Park et al. | 438/48 |
| 2007/0064139 A1* | 3/2007 | Nagase et al. | 348/311 |
| 2007/0075337 A1* | 4/2007 | Jung et al. | 257/215 |
| 2007/0246756 A1* | 10/2007 | Mouli | 257/292 |
| 2008/0224187 A1* | 9/2008 | Park et al. | 257/292 |

FOREIGN PATENT DOCUMENTS

| | | |
|---|---|---|
| TW | I259591 | 8/2006 |
| TW | 200633194 | 9/2006 |

* cited by examiner

US 8,053,287 B2

METHOD FOR MAKING MULTI-STEP PHOTODIODE JUNCTION STRUCTURE FOR BACKSIDE ILLUMINATED SENSOR

BACKGROUND

An image sensor provides a grid of pixels, such as photosensitive diodes or photodiodes, reset transistors, source follower transistors, pinned layer photodiodes, and/or transfer transistors, for recording an intensity or brightness of light. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor.

Backside illuminated sensors are used for sensing a volume of exposed light projected towards the backside surface of a substrate. The pixels are located on a front side of the substrate, and the substrate is thin enough so that light projected towards the backside of the substrate can reach the pixels. Backside illuminated sensors provide a high fill factor and reduced destructive interference, as compared to frontside illuminated sensors.

A need exists for a method that provides a backside illuminated sensor with good photo sensitivity without affecting the performance of the devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
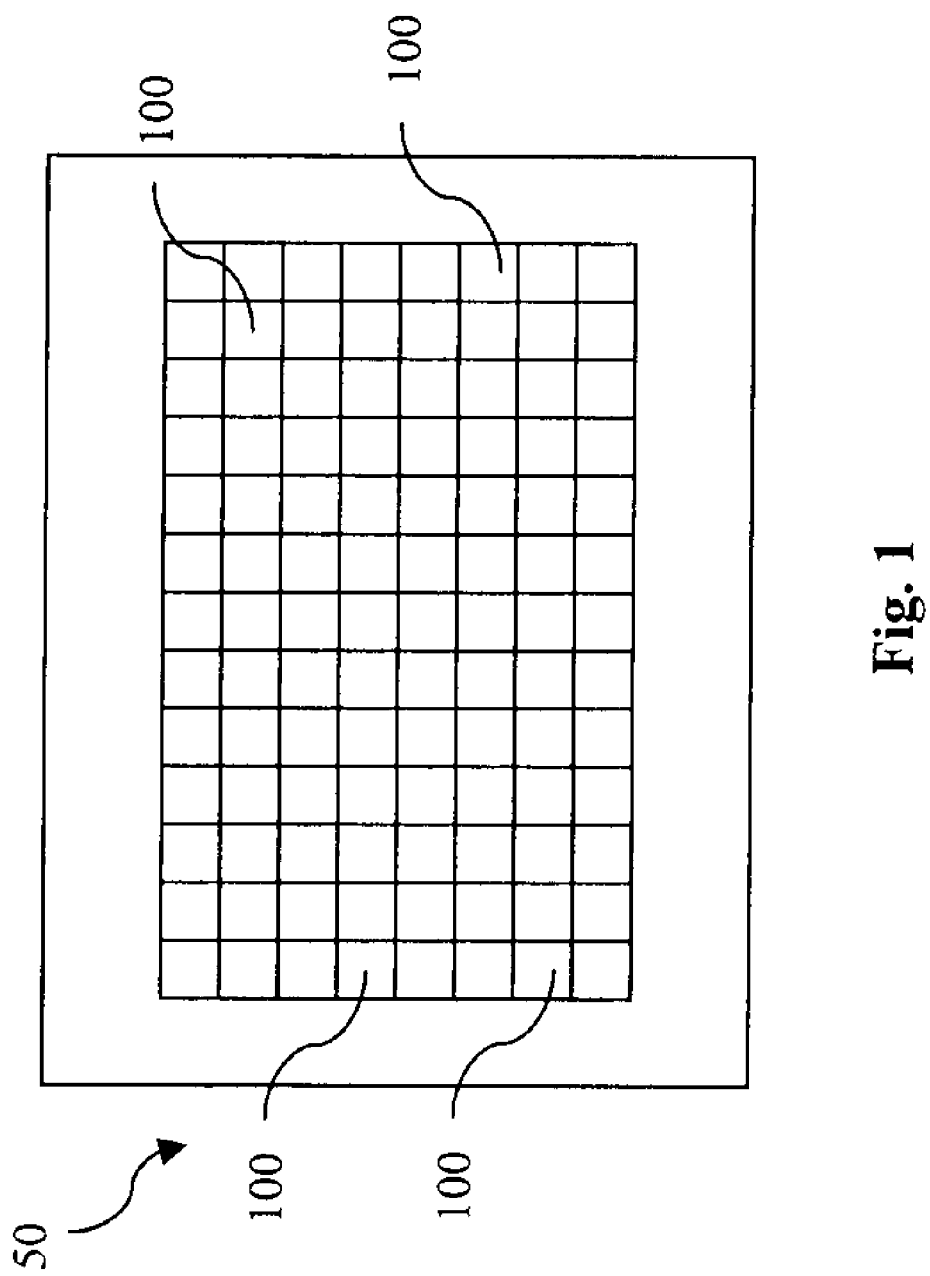
FIG. 1 is a top view of a sensor device including a plurality of pixels, according to one or more embodiments of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid of backside illuminated (or back-illuminated) pixels 100. In the present embodiment, the pixels 100 are photosensitive diodes or photodiodes, for recording an intensity or brightness of light on the diode. The pixels 100 may include reset transistors, source follower transistors, pinned layer photodiodes, and transfer transistors. The image sensor 50 can be of various different types, including a charge-coupled device (CCD), a complimentary metal oxide semiconductor (CMOS) image sensor (CIS), an active-pixel sensor (ACP), or a passive-pixel sensor. Additional circuitry and input/outputs are typically provided adjacent to the grid of pixels 100 for providing an operation environment for the pixels and for supporting external communications with the pixels.

Figure 2:
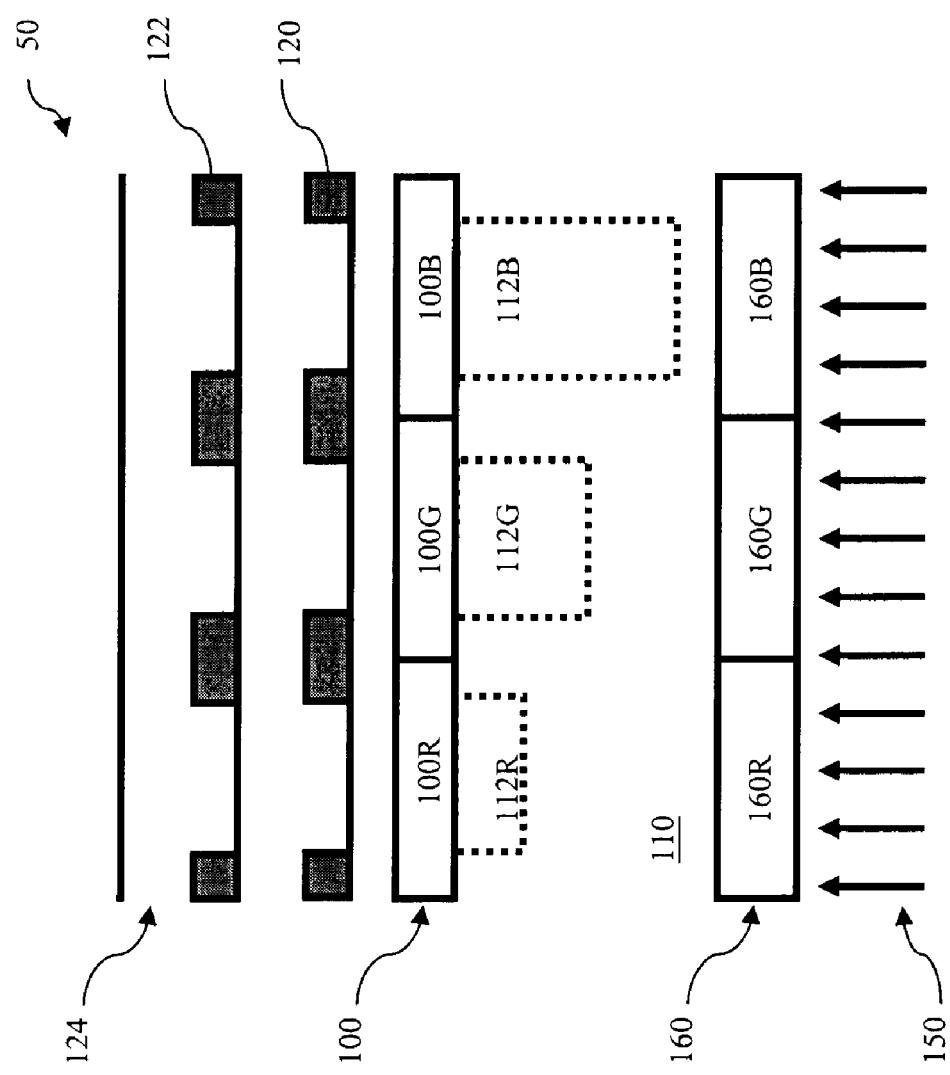
FIG. 2 is a sectional view of a sensor having a plurality of backside illuminated pixels constructed according to aspects of the present disclosure.

Referring now to FIG. 2, the sensor 50 includes a silicon substrate 110. Alternatively, the substrate 110 may comprise an elementary semiconductor such as silicon, germanium, and diamond. The substrate 110 may also comprise a compound semiconductor such as silicon carbide, gallium arsenic, indium arsenide, and indium phosphide. Also, semiconductor arrangements such as silicon-on-insulator and/or an epitaxial layer can be provided. The substrate 110 may comprise an alloy semiconductor such as silicon germanium, silicon germanium carbide, gallium arsenic phosphide, and gallium indium phosphide. In the present embodiment, the substrate 110 comprises P-type silicon. All doping may be implemented using a process such as ion implantation or diffusion in various steps. The substrate 110 may comprise lateral isolation features to separate different devices formed on the substrate.

The sensor 50 includes a plurality of pixels 100 formed on the front surface of the semiconductor substrate 110. For the sake of example, the pixels are further labeled 100R, 100G, and 100B to correspond with example light wavelengths of red, green, and blue, respectively. The pixels 100 each comprise a light-sensing region (or photo-sensing region) which in the present embodiment is an N-type doped region 112 having dopants formed in the semiconductor substrate 110 by a method such as diffusion or ion implantation. In continuance of the present example, the doped regions are further labeled 112R, 112G, and 112B to correspond with the pixels 100R, 100G, and 100B, respectively.

The sensor 50 further includes additional layers, including first and second metal layers 120, 122 and inter-level dielectric 124. The dielectric layer comprises a low-k material, as compared to a dielectric constant of silicon dioxide. Alternatively, the dielectric layer 124 may comprise carbon-doped silicon oxide, fluorine-doped silicon oxide, silicon oxide, silicon nitride, and/or organic low-k material. The material of metal layers 120 and 122 may include aluminum, copper, tungsten, titanium, titanium nitride, tantalum, tantalum nitride, metal silicide, or combinations thereof.

Additional circuitry also exists to provide an appropriate functionality to handle the type of pixels 100 being used and the type of light being sensed. It is understood that the wavelengths red, green, and blue are provided for the sake of example, and that the pixels 100 are generally illustrated as being photodiodes for the sake of example.

The sensor 50 is designed to receive light 150 directed towards the back surface of the semiconductor substrate 110 during applications, eliminating any obstructions to the optical paths by other objects such as gate features and metal lines, and maximizing the exposure of the light-sensing region to the illuminated light. The substrate 110 may be thinned such that the light 150 directed through the back surface thereof may effectively reach on the pixels 100. The illuminated light 150 may not be limited to visual light beam, but can be infrared (IR), ultraviolet (UV), and other proper radiation beam.

The sensor 50 further comprises a color filter layer. The color filter layer can support several different color filters (e.g., red, green, and blue), and may be positioned such that the incident light is directed thereon and there through. In one embodiment, such color-transparent layers may comprise a polymeric material (e.g., negative photoresist based on an acrylic polymer) or resin. The color filter layer may comprise negative photoresist based on an acrylic polymer including color pigments. In continuance of the present example, color filters 160R, 160G, and 160B correspond to pixels 100R, 100G, and 100B, respectively.

The sensor 50 may comprise a plurality of micro-lens interposed between the pixels 100 and the back surface of the semiconductor substrate 110, or between the color filters 160 and the back surface of substrate 110 or between the color filters 160 and the air if the color filters are implemented, such that the backside-illuminated light can be focused on the light-sensing regions.

A problem with backside illuminated sensors is that since the light illuminates from the backside surface, it is difficult to collect electrons generated near the backside surface. Particularly, it is difficult to collect electrons generated from blue light. One way to approach this problem is by enlarging the implant energy to extend the depletion or light sensing region, which improves photo sensitivity. However, high energy ion implantation often impacts performance of the devices.

On the other hand, the self-align N-type implantation is performed in the sensor process to precisely control the sensor performance. In this method, a thick hard mask is formed over a poly layer of a CMOS transistor to control the overlap between the depletion or light sensor region and the poly layer. Thus, pixel performance may be precisely controlled for advance CMOS image sensors that have smaller pixel size. However, self-aligned N-type implantation may only provide a maximum junction depth of less than 1 um. This results in a poor photo sensitivity since the electrons are mostly absorbed by the residual substrate, which in most backside illuminated sensors, has a thickness of greater than 1.5 um.

Figure 3:
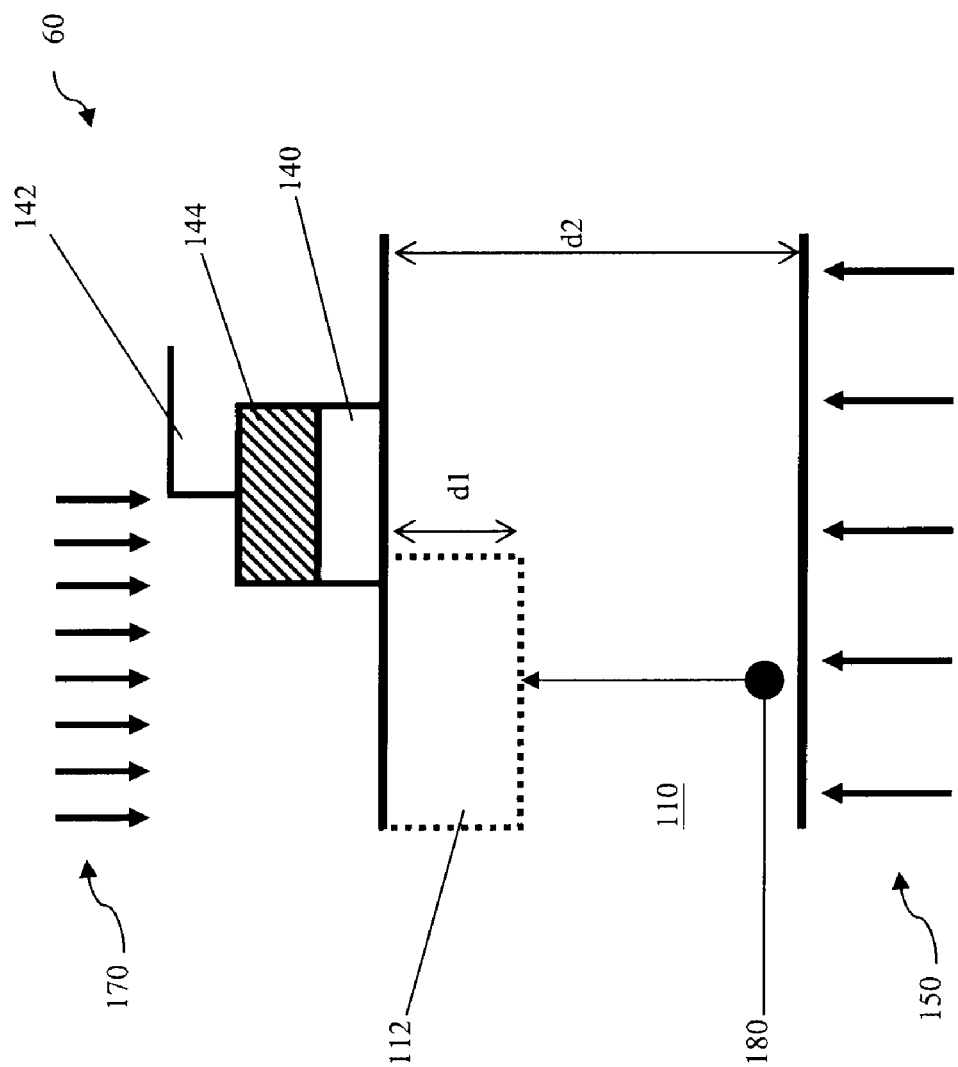
FIG. 3 is a sectional view of a CMOS image sensor with self-align N-type implantation.

Referring to FIG. 3, an exemplary CMOS image sensor is depicted. Within CMOS image sensor 60, there are several CMOS transistors in each pixel 100 for converting electrons 180 to voltage. Each of the CMOS transistors comprises a poly layer 140 as the gate node. In addition, a photoresist 142 is used to define the implant region. The photoresist 142 is patterned before the implantation and removed after the implantation.

When light 150 is directed through the back surface of the semiconductor substrate 110, part of the electrons 180 are absorbed by the residual substrate 110 before reaching pixel 100. A problem exists when a blue light is directed through the residual substrate 110, the electrons 180 are generated much closer to the back surface. As a result, many of the electrons 180 are quickly absorbed by the residual substrate 110 and less electrons 180 reach the photodiode. This leads to poor photo sensitivity and poor pixel performance.

On the other hand, the self-align N-type implantation may be performed on sensor 60 to precisely control the sensor performance, such as the performance of N-type doped region 112. During self-align N-type implantation, a thick hard mask 144 is formed over the poly layer 140 to prevent the ions from passing through. The photoresist 142 is formed over the thick hard mask 144. High energy ion implantation 170 is then performed over the front surface of the semiconductor substrate 110 to form N-type doped region 112. In this illustrative embodiment, N-type doped region 112 is self-aligned to the poly layer 140 in that the overlap between N-type doped region 112 and the poly layer 140 is precisely controlled with the presence of the thick hard mask 144. In this way, pixel performance may be precisely controlled for advanced CMOS image sensors that have smaller pixel size.

However, the use of high energy significantly impacts the performance of the CMOS transistor. In addition, self-aligned N-type implantation only provides a maximum junction depth of less than 1 um. This results in poor photo sensitivity. In this illustrative example, the thickness d1 of the N-type doped region 112 or junction depth is less than 1 um, for example, 0.7 um. Since most backside illuminated sensors have a residual substrate 110 thickness d2 of greater than 1.5 um, many of the electrons 180 generated near the back surface are absorbed by the residual substrate 110 before reaching the pixel.

Figure 4:
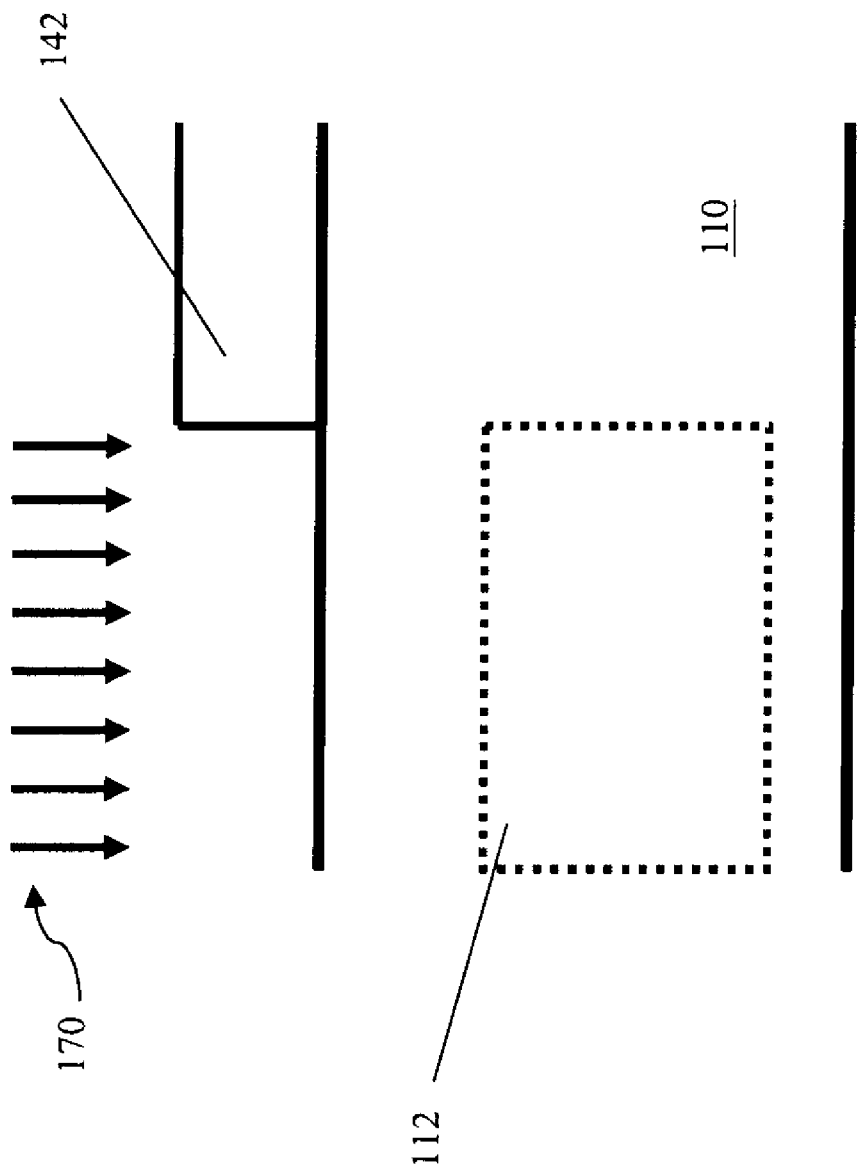
FIG. 4 is a sectional view of a CMOS image sensor with non-self-align N-type high energy ion implantation performed prior to forming a poly layer.

In another embodiment, a method for making a multi-step photodiode junction structure that combines non-self-align and self-align N-type implantations to improve photo sensitivity is provided. Referring to FIG. 4, in an illustrative embodiment, a non-self-align N-type implantation is performed prior to forming the poly layer 140. High energy ion implantation 170 is performed over the front surface of the semiconductor substrate 110 to form a first N-type doped region 112. The photoresist 142 is patterned over the substrate 110 to define the implant region 112 and is removed after the ion implantation. The energy for implantation may vary depending on the dosage. An exemplary range of implantation energy is between about 100 keV and about 3000 KeV. Since the implantation is performed prior to forming of the poly layer 140, high energy may be used to implant a deeper N-type doped region without the concern of ions passing through the poly layer 140 and impacting the performance of the CMOS transistor. With this high energy, the first N-type doped region 112 is implanted to a depth that is greater than 50 percent of the residual substrate 110.

Figure 5:
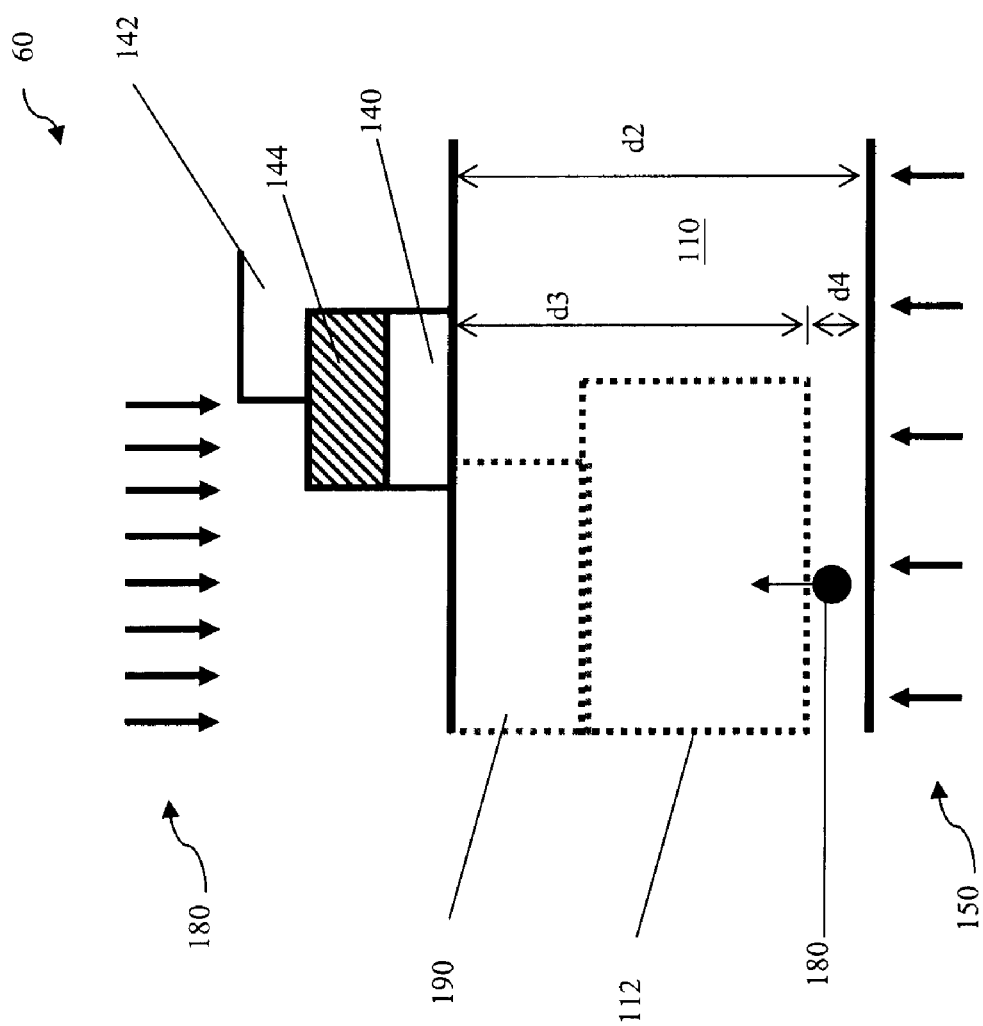
FIG. 5 is a sectional view of a CMOS image sensor with self-align N-type high energy ion implantation performed after forming of the poly layer.

Referring to FIG. 5, once the non-self-align N-type implantation is complete, the poly layer 140 may be formed over the substrate 110. A self-align N-type implantation is then performed to form a second N-type doped region 190. A thick hard mask 144 is first formed over the poly layer 140 to prevent the ions from passing through and thus impacting the performance of the CMOS transistor. A photoresist 142 is formed over the thick hard mask 144. High energy ion implantation 180 is then performed over the front surface of the semiconductor substrate 110 to form the second N-type doped region 190. The energy for implantation may vary depending on the dosage. An exemplary range of implantation energy 180 is between about 5 keV and about 500 KeV.

As shown in FIG. 5, the second N-type doped region 190 is self-aligned to the poly layer 140 in that the overlap between second N-type doped region 190 and the poly layer 140 is precisely controlled with presence of the thick hard mask 144. In this illustrative embodiment, the second N-type doped region 190 is formed directly over and contiguous to the first N-type doped region 112. However, other arrangements of the first N-type doped region 112 and the second N-type doped region 190 may be formed within the substrate without departing the spirit and scope of the present disclosure, as long as both doped regions are contiguous to one another and the second N-type doped region 190 being implanted above the first N-type doped region 112. For example, a portion of the second N-type doped region 190 may be implanted directly over the first N-type doped region 112 while the remaining portion of the second N-type doped region 190 overlaps with the poly layer 140.

In this illustrative embodiment, the thickness d3 of the combined N-type doped regions 112 and 190 or the deepest junction depth is greater than 50 percent of the residual substrate 110. For example, if the residual substrate 110 thickness d2 is 1.5 um, the thickness d3 of the combined doped regions 112 and 190 is greater than 50 percent of the residual substrate 110 thickness or 0.75 um. In this example, the thickness d3 of the combined doped regions 112 and 190 may be larger than 1 um.

The increased thickness or junction depth results in a distance d4 between the combined doped region 112 and 190 and the back surface that is less than 50 percent of the residual substrate. Continuing with the above example, if the combined thickness d3 is 1 um, the distance d4 between the combined doped regions and the back surface is 0.5 um, which is less than 50 percent of the residual substrate 110 thickness d2 or 0.75 um. With a shorter distance between the doped regions and the back surface, electrons 180 may reach the pixel more easily without being absorbed by the residual substrate 110.

Figure 6:
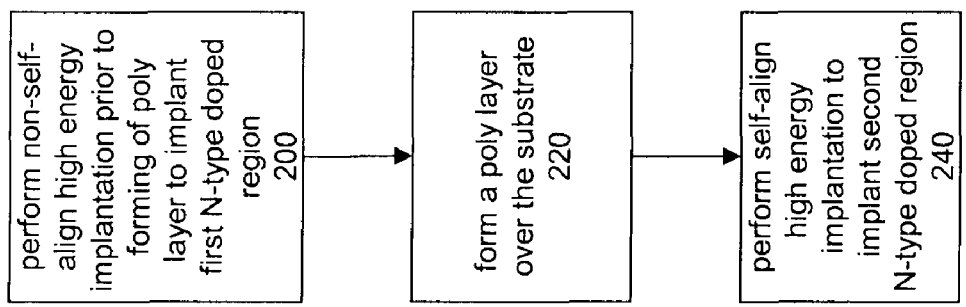
FIG. 6 is a flowchart of an exemplary process for making a multi-step photodiode junction structure for backside illuminated sensors.

Referring to FIG. 6, a flowchart of an exemplary process for making a multi-step photodiode junction structure for backside illuminated sensors is depicted. The process begins at step 200, where a non-self-align high energy ion implantation is performed prior to forming a poly layer to implant a first N-type doped region. Since the implantation is performed prior to forming of the poly layer, high energy may be used to implant a deeper N-type doped region without the concern of ions passing through the poly layer and impacting the performance of the CMOS transistor. With this high energy, the first N-type doped region may be implanted to a depth of greater than 50 percent of the residual substrate 110.

Next, the process proceeds to step 220, where the poly layer is formed over the semiconductor substrate 110. The process then proceeds to step 240, where a self-align high energy ion implantation is performed to implant a second N-type doped region. The second N-type doped region is implanted directly over and contiguous to the first N-type doped region. The self-align high energy ion implantation includes forming a thick hard mask over the poly layer to prevent the ions from passing through and forming a photoresist over the thick hard mask. High energy ion implantation is then performed over the front surface of the semiconductor substrate to form the second N-type doped region.

In summary, aspects of the present disclosure provides a method for making a multi-step photodiode junction structure that improves photo sensitivity without impacting performance of the devices. In particular, the multi-step photodiode structure of the present disclosure allows electrons to reach the pixel or sensor region more easily by extending the N-type doped region and precisely control the overlap between the doped region and the poly layer. In this way, photo sensitivity, especially to blue light, is improved.

In one embodiment, the backside illuminated image sensor provided by the present disclosure comprises a substrate, a first doped region formed within the substrate, and a second doped region formed within the substrate over the first doped region. The first and second doped regions both have a first type conductivity. The first doped region is formed by performing a high energy ion implantation over the substrate, while the second doped region is formed by performing a self-align high energy ion implantation over the substrate. The first doped region is preferably implanted to a depth of greater than 50 percent of thickness of the substrate.

In one embodiment, the second doped region is implanted directly over the first doped region and contiguous to the first doped region. Self-align high energy ion implantation is performed to precisely control the overlap between the second doped region and the layer with presence of a mask formed over the layer. The combined thickness of the first and second doped regions is preferably greater than 50 percent of thickness of the substrate. The distance between back surface of the substrate and the first and second doped regions is less than 50 percent of thickness of the substrate.

In another embodiment, a method of making a backside illuminated sensor is provided which comprises providing a substrate, performing a first ion implantation over the substrate to implant a first doped region, forming a layer over the substrate, and performing a second ion implantation over the substrate to implant a second doped region over the first doped region. The first and second doped regions both have a first type conductivity. The first ion implantation is a non self-aligned ion implantation. The first ion implantation is performed by implanting ions using high energy over the substrate to form a first doped region to depth of greater than 50 percent of thickness of the substrate. The first high energy of implanting the first doped region is about 100 KeV to about 3000 KeV. The second ion implantation is a self-aligned implantation. The second high energy of implanting the second doped region is about 5 KeV to about 500 KeV.

The self-align high energy ion implantation is performed by forming a mask over the device and implanting ions using high energy over the substrate to form a second doped region directly over the first doped region. In addition, ions may be implanted using high energy over the substrate to form a second doped region contiguous to the first doped region. Self-align high energy ion implantation is performed to precisely control the overlap between the second doped region and the layer with presence of a mask formed over the layer.

In one embodiment, the combined thickness of the first and second doped region is greater than 50 percent of thickness of the substrate. The thickness of the substrate is greater than 1.5 um. The distance between back surface of the substrate and the first and second doped regions is less than 50 percent of thickness of the substrate. The first and second doped region form an enlarged light sensing region through which electrons generated from back surface of the surface may reach the pixel.

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method of making a backside illuminated sensor, the method comprising:
   providing a substrate;
   performing a first ion implantation over a surface of the substrate to implant a first doped region having a first conductivity type;
   after performing the first ion implantation, forming a poly layer over the surface of the substrate, the poly layer at least partially covering the first doped region;
   forming a hard mask over the poly layer; and
   performing a second ion implantation over the surface of the substrate to implant a second doped region having the first conductivity type over the first doped region, the second doped region being aligned with the poly layer, having an overlap with the poly layer, and being contiguous to the first doped region;
   wherein the first and second doped region form an enlarged light sensing region through which electrons generated from a back surface of the substrate reach a pixel.

2. The method of claim 1, wherein the first ion implantation is a non self-aligned high energy ion implantation.

3. The method of claim 1, wherein the second ion implantation is a self-aligned high energy ion implantation.

4. The method of claim 1, where performing a first ion implantation over the substrate to implant a first doped region comprises:
   implanting ions using high energy over the substrate to form a first doped region to a depth of greater than 50 percent of thickness of the substrate.

5. The method of claim 1, wherein performing a second ion implantation over the substrate to implant a second doped region over the first doped region comprises:
   implanting ions using high energy over the substrate to form a second doped region directly over the first doped region.

6. The method of claim 1, wherein performing a self-align high energy ion implantation over the substrate to implant a second doped region over the first doped region comprises:
   implanting ions using high energy over the substrate to form the second doped region.

7. The method of claim 1, wherein a combined thickness of the first and second doped region is greater than 50 percent of a thickness of the substrate.

8. The method of claim 1, wherein a thickness of the substrate is greater than about 1.5 µm.

9. The method of claim 1, wherein a distance between a back surface of the substrate and the first and second doped regions is less than 50 percent of thickness of the substrate.

10. The method of claim 1, wherein the overlap between the second doped region and the poly layer is precisely controlled by the hard mask.

11. The method of claim 1, wherein performing a first ion implantation over the substrate to implant a first doped region comprises:
    implanting ions over the substrate using an energy of about 100 KeV to about 3000 KeV to form the first doped region.

12. The method of claim 1, wherein performing a second ion implantation over the substrate to implant a second doped region over the first doped region comprises:
    implanting ions over the substrate using an energy of about 5 KeV to about 500 KeV to form the second doped region.

13. A method of making a backside illuminated sensor, the method comprising:
    providing a substrate having a front surface and a back surface;
    performing a first ion implantation over the front surface of the substrate to form a first doped region as part of a light-sensing region for receiving light from the back surface of the substrate, the first doped region being formed at a depth wherein the first doped region is at a distance from the back surface of the substrate that is less than 50 percent of the thickness of the substrate;
    after forming the first doped region, forming a poly layer over the front surface of the substrate;
    forming a hard mask layer over the poly layer;
    forming a patterned photoresist layer over the front surface of the substrate to protect a portion of the front surface of the substrate and a portion of the hard mask layer; and
    performing a second ion implantation over the front surface of the substrate to form a second doped region over and contiguous with the first doped region, and having an overlap with the poly layer;
    wherein the first and second doped region form an enlarged light sensing region through which electrons generated from the back surface of the substrate reach a pixel.

14. The method of claim 13, wherein the first and second doped regions have a first type conductivity.

15. The method of claim 13, wherein the forming the poly layer includes patterning the poly layer to form a gate structure of a transistor.

16. The method of claim 13, wherein the performing the first ion implantation comprises implanting ions over the substrate using an energy of about 100 KeV to about 3000 KeV to form the first doped region.

17. The method of claim 13, wherein the performing the second ion implantation comprises implanting ions over the substrate using an energy of about 5 KeV to about 500 KeV to form the second doped region.

18. The method of claim 13, wherein a combined thickness of the first and second doped regions is greater than 50 percent of a thickness of the substrate.

19. The method of claim 13, wherein the overlap between the second doped region and the poly layer is precisely controlled by the hard mask layer.

20. The method of claim 15, wherein the second ion implantation process is self-aligned to the gate structure of the transistor.

* * * * *